(12) United States Patent
Kim (10) Patent No.: US 6,424,190 B1
(45) Date of Patent: Jul. 23, 2002

(54) APPARATUS AND METHOD FOR DELAY MATCHING OF FULL AND DIVIDED CLOCK SIGNALS

(75) Inventor: Kwang Y. Kim, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/950,572

(22) Filed: Sep. 13, 2001

(51) Int. Cl.[7] .................................................. H03L 7/00
(52) U.S. Cl. ........................ 327/144; 327/258; 327/309
(58) Field of Search ................................ 327/144, 160, 327/163, 231–233, 239, 240, 246, 247, 250–259, 309, 310, 291–293, 295, 296, 299, 145, 152, 153

(56) References Cited

U.S. PATENT DOCUMENTS

| 5,041,738 A | * | 8/1991 | Walters, Jr. .................. 327/130 |
| 5,453,707 A | * | 9/1995 | Hiratsuka et al. ............. 326/28 |
| 5,608,796 A | * | 3/1997 | Banu et al. .................. 327/254 |
| 6,246,278 B1 | * | 6/2001 | Anderson et al. ........... 327/233 |

* cited by examiner

Primary Examiner—My-Trang Nu Ton
(74) Attorney, Agent, or Firm—Sterne, Kessler, goldstein & Fox P.L.L.C.

(57) ABSTRACT

A transition delay matching circuit in which the transition delay of the divided clock signal is substantially the same as the transition delay of the reference clock signal. The transition delay of the divided clock signal is adjusted by reducing the steady state amplitude of the divided clock signal. Apparatuses and methods for matching the transition delays of the divided clock signal and the reference clock signal are disclosed.

13 Claims, 9 Drawing Sheets

APPARATUS AND METHOD FOR DELAY MATCHING OF FULL AND DIVIDED CLOCK SIGNALS

BACKGROUND OF THE INVENTION

1. Field of the Invention

The invention relates generally to the field of electronic circuitry and, more particularly, to methods and apparatuses for providing a transition delay matching circuit where a divided clock has substantially the same amplitude and transitions at substantially the same time as a full clock.

2. Background Art

A clock signal is used to synchronize components in a circuit so that each component begins its operation for a given cycle simultaneously. Different clock signals require different frequencies depending upon the application for which the clock signal is used. Clocks in present-day electronic circuits typically must transition much more quickly than clocks in older circuits.

Many electronic circuits utilize multiple clocks. Each clock defines a single clock domain. In some circuits, a clock division circuit is used to divide a reference clock into one or more divided clocks, each defining a separate clock domain. Multiple clocks are used for various integrated circuits including, but not limited to, application specific integrated circuits (ASICs), digital signal processors, microprocessors, and controllers. These integrated circuits are used for a wide variety of applications including, but not limited to, computing, networking, communication, telecommunication, and data transmission. Each of these applications may have one or more high frequency clock domains.

For clock signals with higher frequencies, a shorter duration is available for each transition, and the clock signal may not be able to completely transition from a starting voltage level to a final voltage level. The peak-to-peak signal swing may thus be smaller than the maximum voltage swing permissible by the clock driver. Conversely, clock signals with lower frequencies have a longer time duration available for each transition and the clock signal may be able to completely transition from the starting voltage level to the final voltage level. The peak-to-peak signal swing may thus be greater because more time is available to complete the transition. However, for the next clock transition, the lower frequency clock signal starts from a higher (or lower) voltage level and therefore requires a longer time period to transition to a mid-point (e.g., see FIG. 2A described below). Thus, a skew exists between the transition delay of a high frequency clock signal and the transition delay of a low frequency clock signal where the transition delay is the time required for a clock signal to transition from a final voltage level to a mid-point.

When this skew between the transition delay of the high frequency clock and the transition delay of the low frequency clock is added to the setup time for a receiving device clocked by the high frequency clock, the receiving device may not detect the low frequency clock in the proper high frequency clock cycle. Specifically, if the sum of the skew and the setup time at the receiving device is approximately equal to the period of the high frequency clock and the circuit is under noisy conditions, the receiving device may randomly detect the low frequency clock in either the proper cycle or a cycle too late. More specifically, this condition may occur when the high frequency clock is a harmonic of the low frequency clock.

What is needed is a transition delay matching circuit that matches the transition delay of a low frequency clock to the transition delay of a high frequency clock that is a harmonic of the low frequency clock.

BRIEF SUMMARY OF THE INVENTION

Briefly stated, the present invention is directed to methods and apparatuses for implementing a transition delay matching circuit for which the one or more output clocks of the transition delay matching circuit have substantially equivalent transition delays to bandwidth-limited clocks having a frequency equal to a harmonic of the frequency of the output clocks, and applications thereof.

In an embodiment, the invention operates by limiting the amplitude of the output of the transition delay matching circuit. In a preferred embodiment, the amplitude of the output of the transition delay matching circuit is substantially similar to the amplitude of the reference clock. In the preferred embodiment, the divided clock and the reference clock transition after approximately the same amount of delay because their amplitudes are substantially similar.

In a embodiment of the present invention, the amplitude of the divided clock is limited by placing one or more resistors between a positive divided clock output and a negative divided clock output.

In an alternate embodiment of the present invention, the amplitude of the divided clock is limited by placing a resistor between a divided clock output and a common mode voltage level.

Further embodiments, features, and advantages of the present invention, as well as the structure and operation of various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

In the drawings.

The present invention will now be described with reference to the accompanying drawings. In the drawings, like reference numbers indicate identical or functionally similar elements. Additionally, the leftmost digit(s) of a reference number identifies the drawing in which the reference number first appears.

DETAILED DESCRIPTION OF THE INVENTION

Table of Contents

I. Overview and Discussion

II. Terminology

III. Transition Delay Matching Circuit
    A. Example Embodiments
        1. Example Embodiment #1: Two-Clock Transition Delay Matching Circuit
        2. Example Embodiment #2: One-Clock Transition Delay Matching Circuit
        3. Example Embodiment #3: Two One-Clock Transition Delay Matching Circuits
        4. Example Embodiment #4: Two-Clock Transition Delay Matching Circuit with Center Tap IV. Conclusion

I. Overview and Discussion

The present invention is directed to methods and apparatuses for implementing a transition delay matching circuit for which the one or more output clocks of the transition delay matching circuit have substantially equivalent transition delays to clocks having a frequency equal to a harmonic of the frequency of the output clocks.

Figure 1:
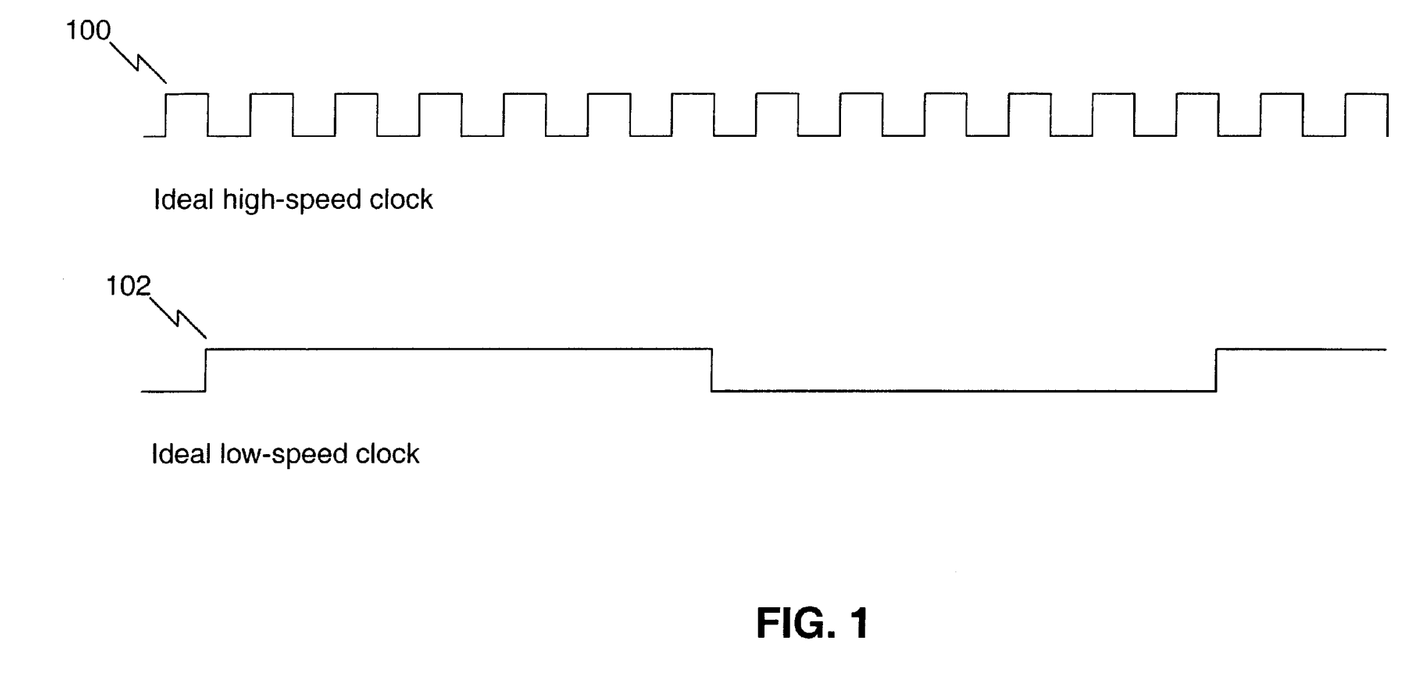
FIG. 1 is a wave diagram of an ideal high frequency clock and an ideal low frequency clock.

Clock synchronization becomes more difficult as the frequencies of the clocks increase. FIG. 1 illustrates an ideal divided clock 102 for which a falling edge is in phase with the falling edge of a full clock 100 (i.e., the two falling edges occur at the same time). The full clock 100 has a frequency equal to a harmonic of the divided clock 102. In the case of ideal clocks, clock synchronization between low frequency clocks and high frequency clocks is easily achieved because the peak-to-peak voltage swing happens instantaneously.

Figure 2A:
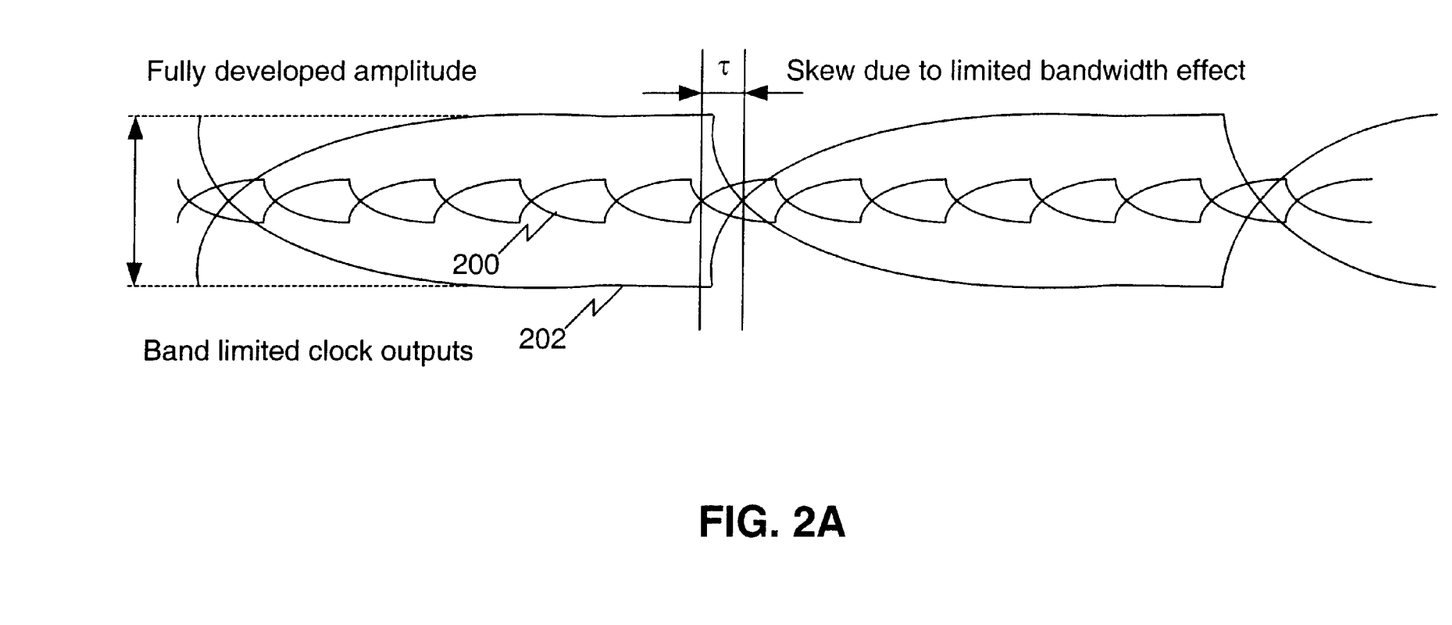
FIG. 2A is a wave diagram depicting the correlation between peak-to-peak voltage transition and transition delay for unadjusted clock signals.

As the clock frequency of a full clock 200 surpasses the bandwidth of its driver circuit, as shown in FIG. 2A, the full clock 200 does not achieve a steady state voltage at the maximum or minimum drive voltages prior to the next transition of the full clock 200. On the other hand, the divided clock 202 generated from the full clock 200 does achieve a steady state voltage at the maximum and minimum voltages when it transitions because it has more time in which to transition. Alternate embodiments utilizing a divided clock with a frequency that is a different subharmonic of the full clock will be apparent to persons skilled in the relevant art(s) based on the teachings herein. The invention is intended and adapted to include all such alternate embodiments.

As the frequency of the full clock 200 increases, the ratio between the period of the full clock 200 and the delay to a crossing point of a divided clock 202 and a 180 degree out of phase clock at the same frequency (the "transition delay") decreases. As the sum of the transition delay of the divided clock 202 and a setup time for a circuit receiving the divided clock 202 approaches the period of the full clock 200, the circuit receiving the divided clock 202 may sense the divided clock 202 one period of the full clock 200 later than expected. If the circuit is under noisy conditions and the sum of the transition delay of the divided clock 202 and the setup time of the receiving circuit approximately equals the period of the full clock 200, the divided clock 202 may be sensed by the receiving circuit one cycle of the full clock 200 earlier or later than anticipated.

Figure 2B:
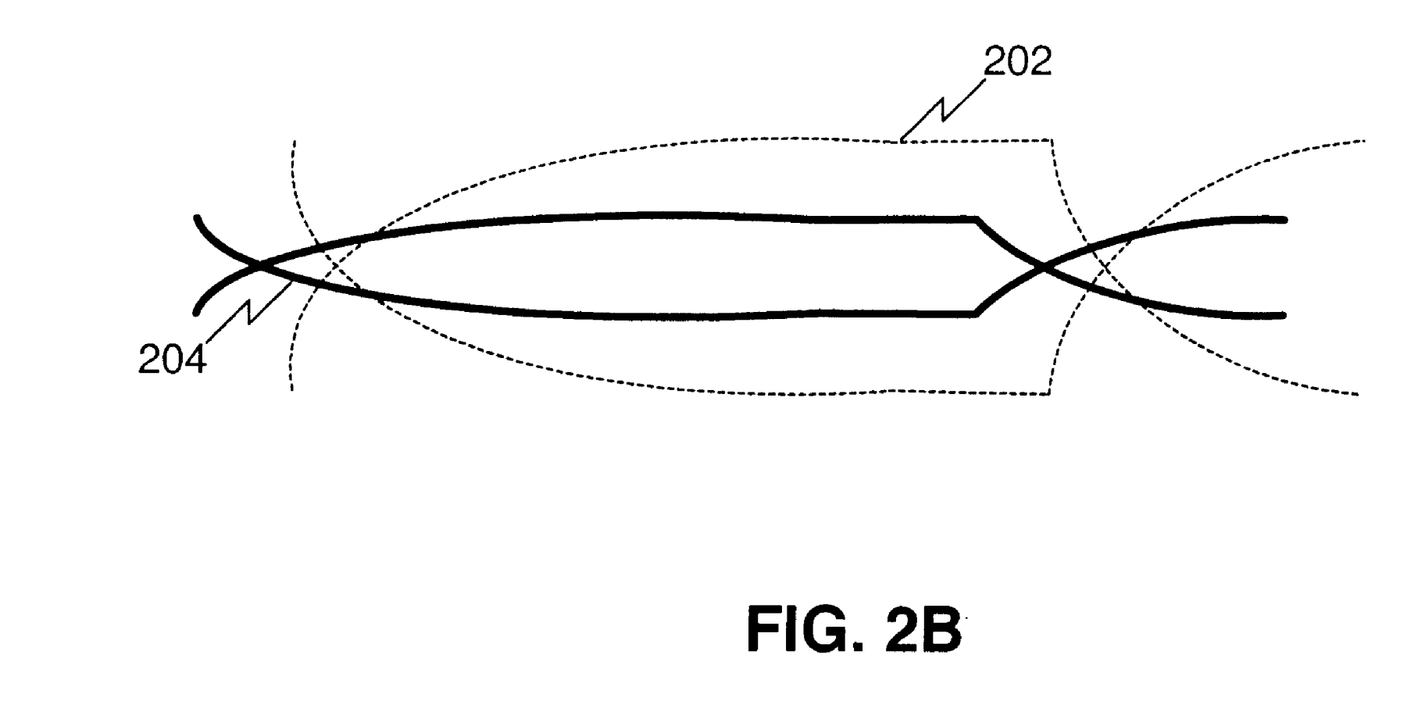
FIG. 2B is a wave diagram depicting the correlation between peak-to-peak voltage transition and transition delay between an unadjusted clock signal and a clock signal adjusted by an embodiment of the present invention.

FIG. 2B illustrates an unadjusted divided clock 202 and a divided clock adjusted by an embodiment of the present invention 204. The amplitude of the unadjusted divided clock 202 reaches the maximum and minimum voltages supplied by an output clock driver. In contrast, the adjusted divided clock 204 is limited by an embodiment of the present invention to the peak-to-peak voltage achieved by the full clock 200 in FIG. 2A. As such, the transition delay for the adjusted divided clock 204 is reduced from the transition delay in the unadjusted divided clock 202.

Figure 2C:
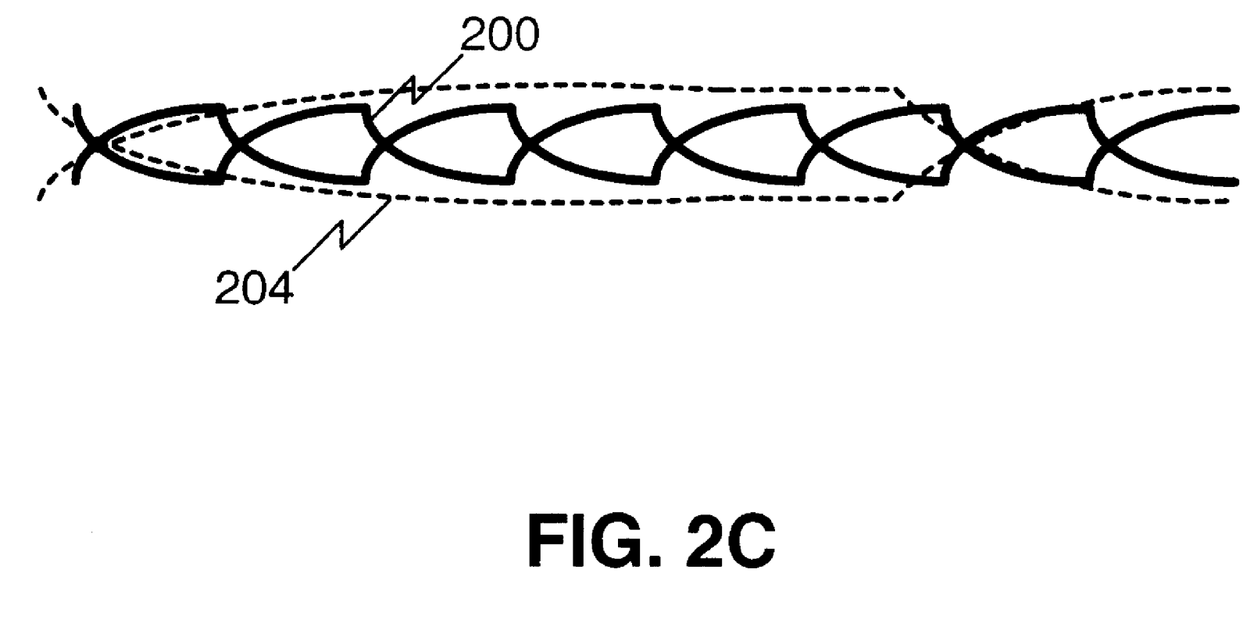
FIG. 2C is a wave diagram depicting the correlation between peak-to-peak voltage transition and transition delay for clock signals adjusted by an embodiment of the present invention.

FIG. 2C illustrates the full clock 200 and the adjusted divided clock 204. In this case, because the amplitude of the full clock 200 is substantially equal to the amplitude of the adjusted clock 204 just prior to a transition of the adjusted divided clock 204. the transition delay of the adjusted divided clock 204 is substantially equal to the transition delay of the full clock 200. As such, the delay of the full clock 200 and the adjusted divided clock 204 are matched.

The present invention is described in terms of this example environment. Description in these terms is provided for illustrative purposes. It is not intended that the invention be limited to application in these example environments. In fact, after reading the following description, it will become apparent to a person skilled in the relevant art how to implement the invention in alternative environments known now or developed in the future.

II. Terminology

To more clearly delineate the present invention, an effort is made throughout the specification to adhere to the following term definitions as consistently as possible.

The term "clock" refers to a signal transitioning between a low voltage and a high voltage having a substantially periodic frequency.

The term "mid-point" refers to a voltage level that is approximately equal to one-half of the sum of the highest voltage level achieved by a clock signal and the lowest voltage level achieved by a clock signal during a clock cycle.

The term "transition delay" refers to the time a signal requires to change from a starting voltage level to a mid-point.

III. Transition Delay Matching Circuit

Figure 3:
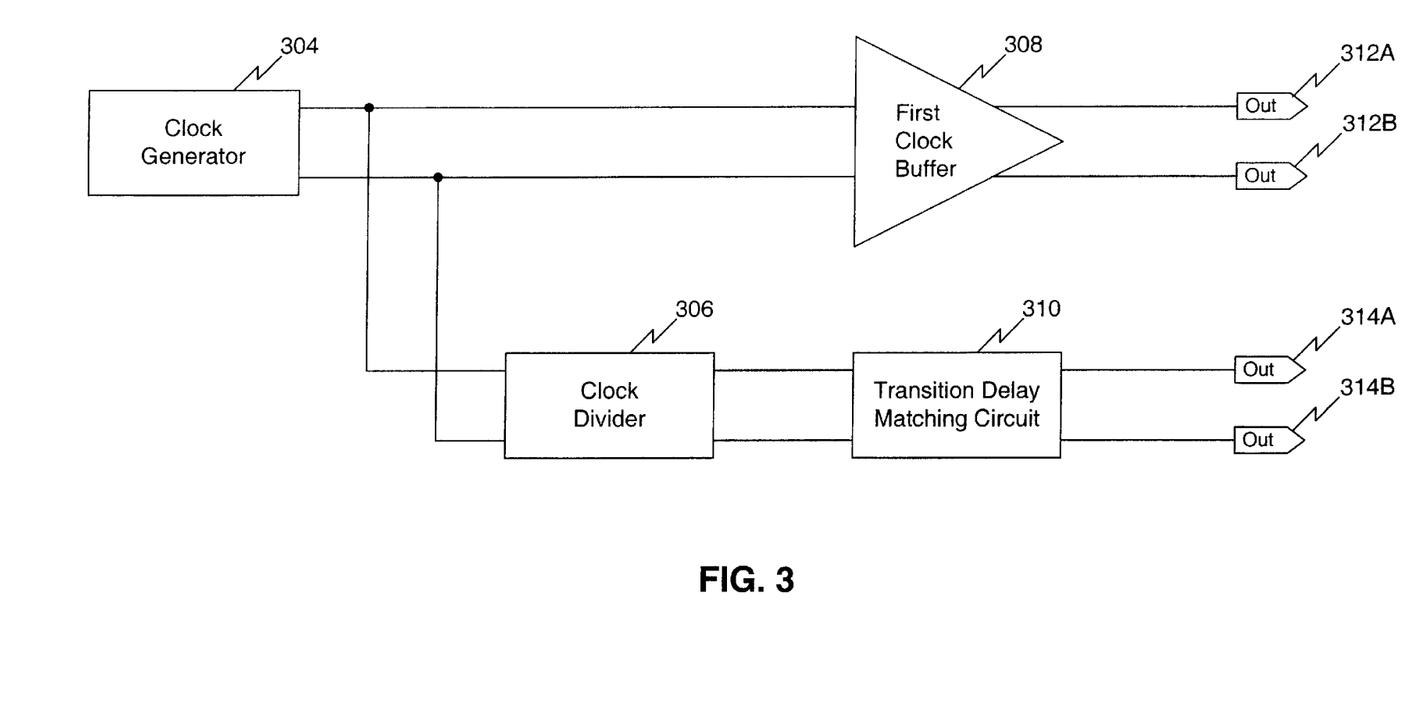
FIG. 3 is a block diagram of an exemplary system incorporating a transition delay matching circuit according to an embodiment of the present invention.

FIG. 3 depicts a block diagram of an example system incorporating a clock generator 304, a clock divider 306, a first clock buffer 308, a transition delay matching circuit 310, one or more clock output terminals 312A-n, and one or more divided clock output terminals 314A-n. In FIG. 3, two clock output terminals 312A and 312B and two divided clock output terminals 314A and 314B are shown.

In operation, the clock generator 304 outputs one or more clock signals. In a preferred embodiment of the present invention, the clock generator 304 produces a first clock signal and a second clock signal that is substantially 180 degrees out of phase with the first clock signal. Clock generators such as clock generator 304, are well known in the art as would be apparent to persons skilled in the relevant art. Alternate embodiments utilizing plural clock generators to produce the first clock signal and the second clock signal will be apparent to persons skilled in the relevant art(s) based on the teachings herein. The invention is intended and adapted to include all such alternate embodiments.

The clock divider 306 has its inputs coupled to the clock generator 304 and its outputs coupled to the transition delay matching circuit 310. The clock divider 306 receives the one or more clock signals from the clock generator 304 and outputs one or more divided clock signals. In a preferred embodiment, the clock divider outputs a first divided clock signal and a second divided clock signal that is substantially 180 degrees out of phase with the first divided clock signal. Clock divider circuits, such as clock divider 306, are well known in the art, as would be apparent to persons skilled in the relevant air. Alternate embodiments utilizing a different number of clock dividers 306 will be apparent to persons skilled in the relevant art(s) based on the teachings herein. The invention is intended and adapted to include all such alternate embodiments.

The first clock buffer 308 has its inputs coupled to the clock generator 304 and its outputs coupled to the one or more clock output terminals 312A-n. The first clock buffer 308 receives the one or more clock signals and outputs one or more output clock signals. In an embodiment of the present invention, the first clock buffer 308 receives the one or more clock signals and amplifies the signals before outputting them to the one or more clock output terminals 312A-n. Alternately or additionally, the first clock buffer 308 adjusts the common mode voltage level of the one or more output clock signals.

The transition delay matching circuit 310 has its inputs coupled to the outputs of the clock divider 306 and outputs coupled to the one or more divided clock output terminals 314A-n. The transition delay matching circuit 310 receives the one or more divided clock signals and outputs one or more output divided clock signals. In an embodiment, each of the one or more output divided clock signals transitions from a low voltage level to a high voltage level or a high voltage level to a low voltage level at substantially the same time as one of the one or more output clock signals transitions from a low voltage level to a high voltage level. In a further embodiment, each of the one or more output divided clock signals transitions from a low voltage level to a high voltage level or a high voltage level to a low voltage level at substantially the same time as one of the one or more output clock signals transitions from a high voltage level to a low voltage level. In a preferred embodiment of the present invention, the one or more output divided clock signals have amplitudes substantially equal to the amplitude of each of the one or more output clock signals.

A. Example Embodiments

Various embodiments related to the methods and structures described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art based on the teachings herein. The invention is intended and adapted to include such alternate embodiments.

1. Example Embodiment #1: Two-Clock Transition Delay Matching Circuit

Figure 4:
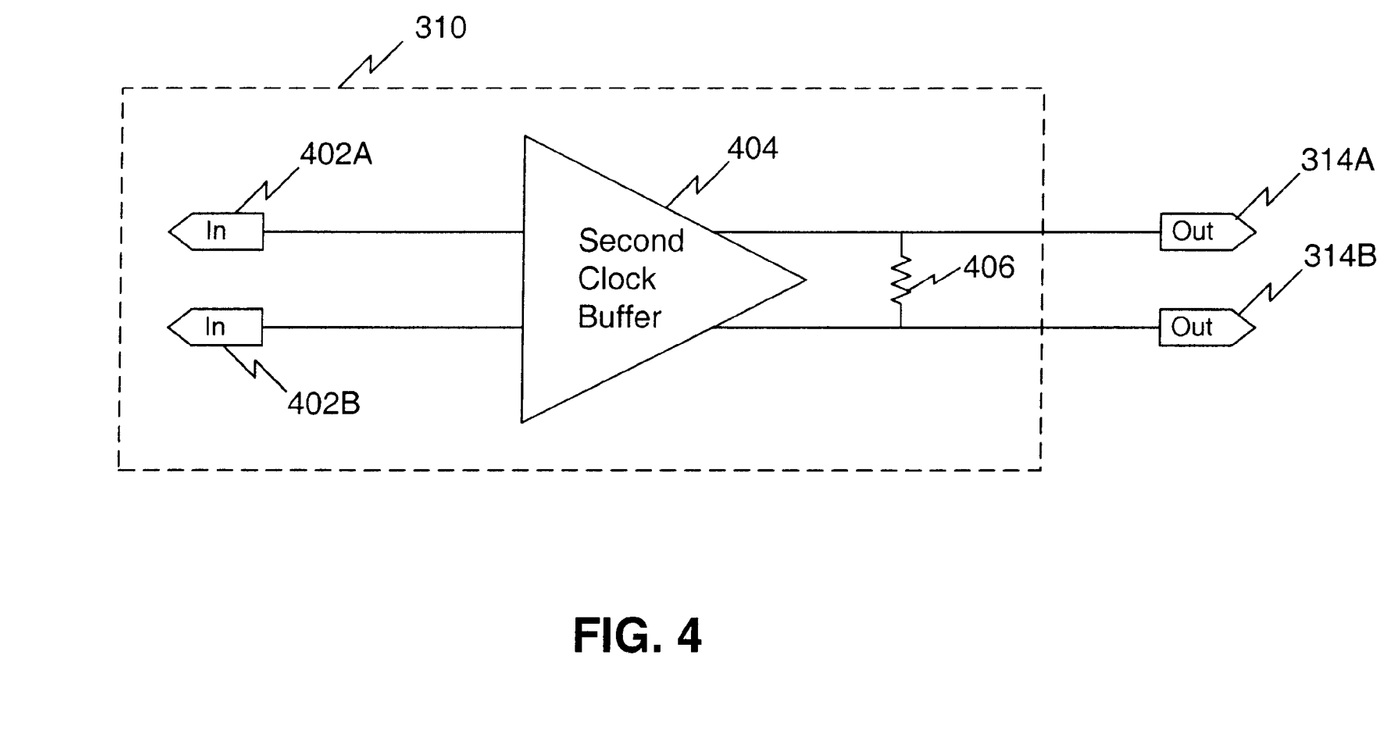
FIG. 4 is a component-level diagram of a transition delay matching circuit according to an embodiment of the present invention.

FIG. 4 illustrates a block diagram of the transition delay matching circuit 310 including a first divided clock input terminal 402A, a second divided clock input terminal 402B, a second clock buffer 404, and a resistor 406. FIG. 4 also includes a first divided clock output terminal 314A and a second divided clock output terminal 314B, In operation, the second clock buffer 404 has its inputs coupled to the first divided clock input terminal 402A and the second divided clock input terminal 402B, and its outputs coupled to the first divided clock output terminal 314A and the second divided clock output terminal 314B. Moreover, each output of the second clock buffer 404 is coupled to one terminal of the resistor 406. The second clock buffer 404 receives a first divided clock signal and a second divided clock signal and outputs a first output divided clock signal and a second output divided clock signal. In an embodiment, the first output divided clock signal is substantially 180 degrees out of phase with the second output divided clock signal. In an embodiment of the present invention, the second clock buffer 404 amplifies the first divided clock signal to produce the first output divided clock signal and amplifies the second divided clock signal to produce the second output divided clock signal. Alternately or additionally, the second clock buffer 404 adjusts a first common mode voltage level of the first divided clock signal to produce a second common mode voltage level for the first output divided clock signal and adjusts the first common mode voltage level of the second divided clock signal to produce the second common mode voltage level for the second output divided clock signal.

The resistor 406 is used to adjust the amplitude of the first output divided clock signal and the second output divided clock signal. The resistor 406 is coupled between the first divided clock output terminal 314A and the second divided clock output terminal 314B.

2. Example Embodiment #2: One-Clock Transition Delay Matching Circuit

Figure 5:
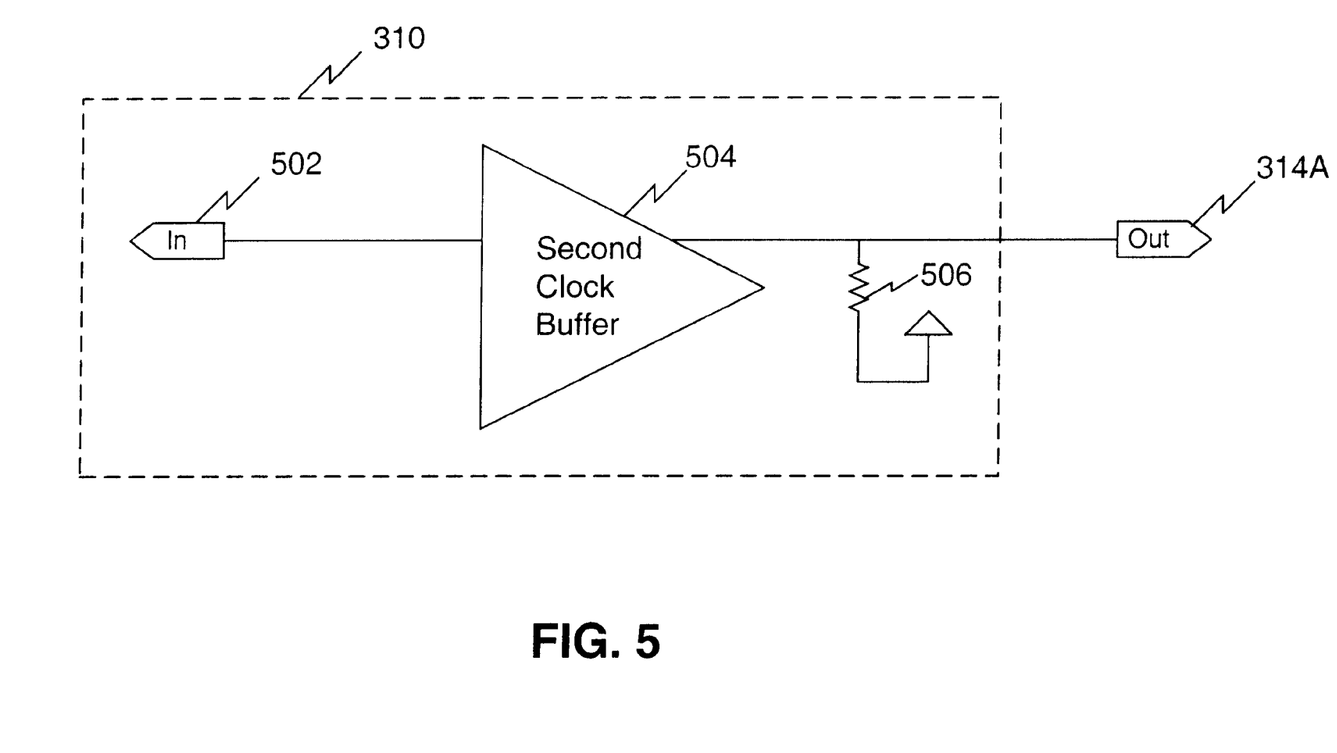
FIG. 5 is a component-level diagram of a transition delay matching circuit according to an embodiment of the present invention.

FIG. 5 illustrates a block diagram of the transition delay matching circuit 310 including a divided clock input terminal 502, a second clock buffer 504, and a resistor 506. FIG. 5 also includes a divided clock output terminal 314A.

In operation, the second clock buffer 504 has its input coupled to the divided clock input terminal 502 and its output coupled to the divided clock output terminal 314A. Moreover, the output of the second clock buffer 504 is coupled to one terminal of the resistor 506. The second clock buffer 504 receives a divided clock signal and outputs an output divided clock signal. In an embodiment of the present invention, the second clock buffer 504 amplifies the divided clock signal to produce the output divided clock signal. Alternately or additionally, the second clock buffer 504 adjusts a common mode voltage level of the divided clock signal to produce a different common mode voltage level for the output divided clock signal.

The resistor 506 is used to adjust the amplitude of the output divided clock signal. The resistor 506 is coupled between the divided clock output terminal 314A and a voltage level. In an embodiment of the present invention, the voltage level tied to the resistor 506 is substantially equal to the common mode voltage level of the output divided clock signal.

3. Example Embodiment #3: Two One-Clock Transition Delay Matching Circuits

Figure 6:
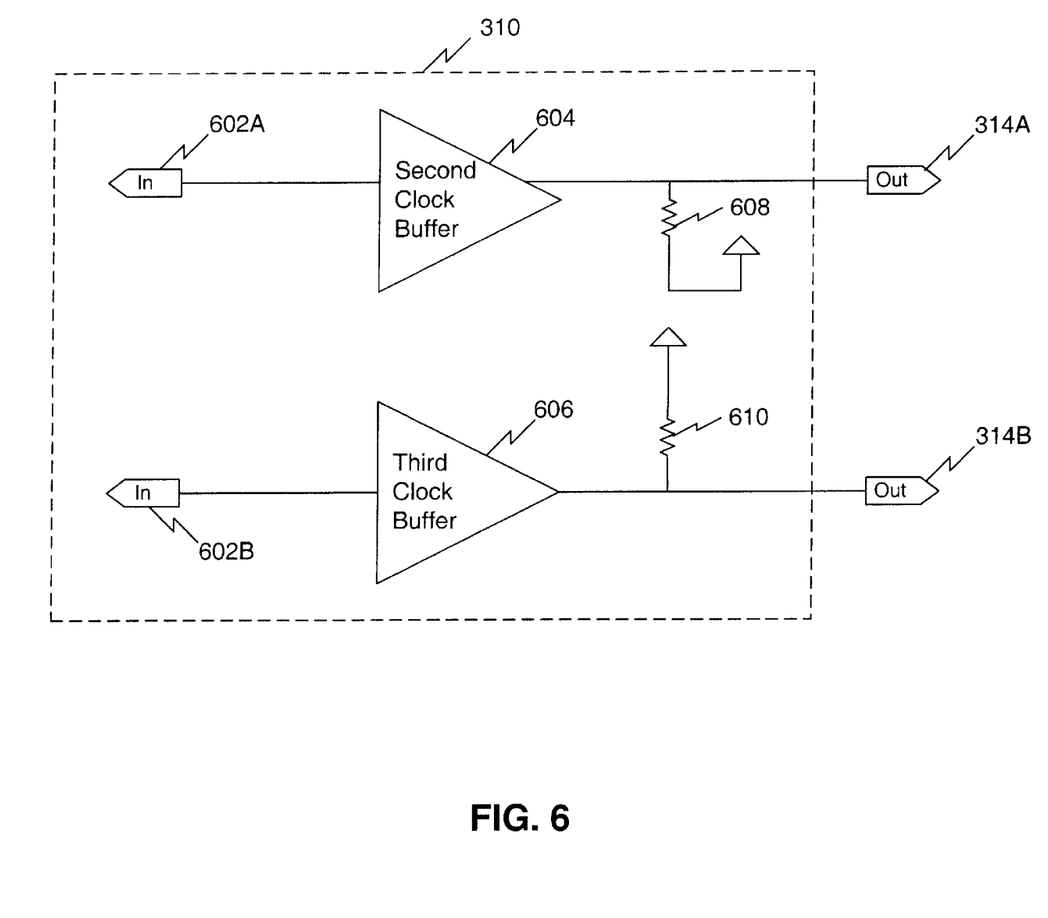
FIG. 6 is a component-level diagram of a transition delay matching circuit according to an embodiment of the present invention.

FIG. 6 depicts a block diagram of the transition delay matching circuit 310 including a first divided clock input terminal 602A, a second divided clock input terminal 602B, a second clock buffer 604, a third clock buffer 606, a first resistor 608, and a second resistor 610. FIG. 6 also includes a first divided clock output terminal 314A and a second divided clock output terminal 314B.

In operation, the second clock buffer 604 has its input coupled to the first divided clock input terminal 602A and its output coupled to the first divided clock output terminal 314A. Moreover, the output of the second clock buffer 604 is coupled to one terminal of the first resistor 608. The second clock buffer 604 receives a first divided clock signal and outputs a first output divided clock signal. In an embodiment of the present invention, the second clock buffer 604 amplifies the first divided clock signal to produce the first output divided clock signal. Alternately or additionally, the second clock buffer 604 adjusts a first common mode voltage level of the first divided clock signal to produce a second common mode voltage level for the first output divided clock signal.

The third clock buffer 606 has its input coupled to the second divided clock input terminal 602B and its output coupled to the second divided clock output terminal 314B. Moreover, the output of the third clock buffer 606 is coupled to one terminal of the second resistor 610. The third clock buffer 606 receives a second divided clock signal and outputs a second output divided clock signal. In an embodiment of the present invention, the third clock buffer 606 amplifies the second divided clock signal to produce the second output divided clock signal. Alternately or additionally, the third clock buffer 606 adjusts a first common mode voltage level of the second divided clock signal to produce a second common mode voltage level for the second output divided clock signal.

The first resistor 608 is used to adjust the amplitude of the first output divided clock signal. The first resistor 608 is coupled between the first divided clock output terminal 314A and a voltage level. In an embodiment of the present invention, the voltage level tied to the first resistor 608 is substantially equal to the second common mode voltage level.

The second resistor 610 is used to adjust the amplitude of the second output divided clock signal. The second resistor 610 is coupled between the second divided clock output terminal 314B and a voltage level. In an embodiment of the present invention, the voltage level tied to the second resistor 610 is substantially equal to the second common mode voltage level.

Figure 7:
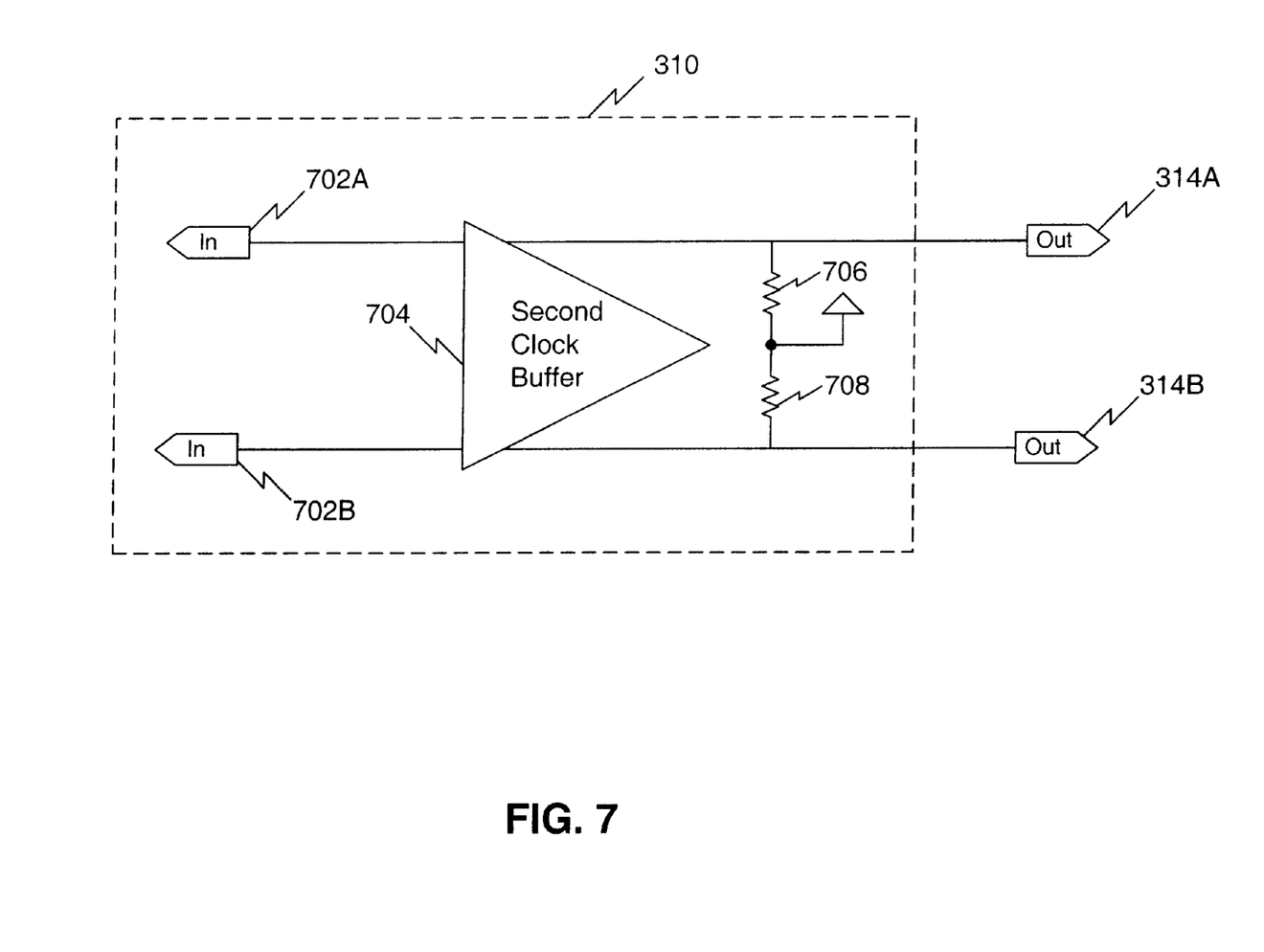
FIG. 7 is a component-level diagram of a transition delay matching circuit according to an embodiment of the present invention.

4. Example Embodiment #4: Two-Clock Transition Delay Matching Circuit with Center Tap FIG. 7 illustrates a block diagram of the transition delay matching circuit 310 including a first divided clock input terminal 702A, a second divided clock input terminal 702B, a second clock buffer 704, a first resistor 706, and a second resistor 708. FIG. 4 also includes a first divided clock output terminal 314A and a second divided clock output terminal 314B.

In operation, the second clock buffer 704 has its inputs coupled to the first divided clock input terminal 702A and the second divided clock input terminal 702B, and its outputs coupled to the first divided clock output terminal 314A and the second divided clock output terminal 314B. The first output of the second clock buffer 704 is also coupled to one terminal of the first resistor 706. The second output of the second clock buffer 704 is also coupled to one terminal of the first resistor 708. The second clock buffer 704 receives a first divided clock signal and a second divided clock signal and outputs a first output divided clock signal and a second output divided clock signal. In an embodiment, the first output divided clock signal is substantially 180 degrees out of phase with the second output divided clock signal. In an embodiment of the present invention, the second clock buffer 704 amplifies the first divided clock signal to produce the first output divided clock signal and amplifies the second divided clock signal to produce the second output divided clock signal. Alternately or additionally, the second clock buffer 704 adjusts a first common mode voltage level of the first divided clock signal to produce a second common mode voltage level for the first output divided clock signal and adjusts the first common mode voltage level of the second divided clock signal to produce the second common mode voltage level for the second output divided clock signal.

The first resistor 706 is used to adjust the amplitude of the first output divided clock signal. The resistor 706 is coupled between the first divided clock output terminal 314A and a voltage level. In an embodiment of the present invention, the voltage level tied to the first resistor 706 is substantially equal to the second common mode voltage level.

The second resistor 708 is used to adjust the amplitude of the second output divided clock signal. The second resistor 708 is coupled between the second divided clock output terminal 314B and a voltage level. In an embodiment of the present invention, the voltage level tied to the second resistor 708 is substantially equal to the second common mode voltage level.

Buffers, such as clock buffers 704, 604, 606, 504, 404, and 308, are well known in the art, as would be apparent to persons skilled in the relevant art. In a preferred embodiment, conventional current mode logic (CML) buffers are employed. Alternate embodiments utilizing a different number of buffers will be apparent to persons skilled in the relevant art(s) based on the teachings herein. The invention is intended and adapted to include all such alternate embodiments.

IV. Conclusion

While specific embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A transition delay matching circuit comprising:
(a) a first frequency dividing means for implementing frequency division on a first clock signal, said first frequency dividing means producing a first divided clock signal;
(b) a second frequency dividing means for implementing frequency division on a second clock signal, said second frequency dividing means producing a second divided clock signal, wherein said second clock signal is substantially 180 degrees out of phase with said first clock signal; and
(c) amplitude limiting means for limiting a divided clock steady state voltage differential between said first divided clock signal and said second divided clock signal, wherein said first divided clock signal is substantially in phase with said first clock signal, wherein said second divided clock signal is substantially in phase with said second clock signal, wherein said amplitude limiting means causes said divided clock steady state voltage differential to be substantially equal to a voltage differential between said first clock signal and said second clock signal immediately prior to a transition of said first clock signal from one steady state value to another steady state value, so that said first divided clock signal and said second divided clock signal more quickly transition to steady state values.

2. The transition delay matching circuit of claim 1 wherein said amplitude limiting means comprises a resistor.

3. A transition delay matching circuit comprising:
(a) a clock divider having
   (i) a first clock terminal to receive a first clock, said first clock having a first frequency,
   (ii) a second clock terminal to receive a second clock, said second clock having said first frequency, wherein said second clock signal is substantially 180 degrees out of phase with said first clock signal,
   (iii) a first divided clock terminal to output a first divided clock signal, said first divided clock signal having a second frequency equal to said first frequency divided by an integer, wherein said first divided clock signal is substantially in phase with said first clock signal, and
   (iv) a second divided clock terminal to output a second divided clock signal, said second divided clock signal having said second frequency, wherein said second divided clock signal is substantially in phase with said second clock signal; and
(b) a resistor coupled between said first divided clock terminal and said second divided clock terminal, such that a divided clock steady state voltage differential between said first divided clock signal and said second divided clock signal is substantially equal to a voltage differential between said first clock signal and said second clock signal immediately prior to a transition of said first clock signal from one steady state value to another steady state value,
   thereby causing said first divided clock signal and said second divided clock signal to more quickly transition to steady state values.

4. A method of matching a divided clock transition delay to an input clock transition delay, comprising the steps of:
(a) receiving an input clock signal having the input clock transition delay;
(b) producing a divided clock signal having the divided clock transition delay by clock dividing said input clock signal, wherein said divided clock signal is substantially in phase with said input clock signal; and
(c) adjusting an amplitude of said divided clock signal such that the divided clock transition delay is substantially equal to the input clock transition delay, wherein said amplitude of said divided clock signal is substantially equal to an amplitude of said input clock signal immediately prior to a transition of said input clock signal from one steady state value to another steady state value,
   thereby causing said divided clock signal to more quickly transition to a steady state value.

5. A method of matching a divided clock transition delay to an input clock transition delay, comprising the steps of:
(a) receiving a first clock signal having the input clock transition delay;
(b) receiving a second clock signal having the input clock transition delay, wherein said second clock signal is substantially 180 degrees out of phase with said first clock signal;
(c) producing a first divided clock signal having the divided clock transition delay by clock dividing said first clock signal, wherein said first divided clock signal is substantially in phase with said first clock signal;
(d) producing a second divided clock signal having the divided clock transition delay by clock dividing said second clock signal, wherein said second divided clock signal is substantially in phase with said second clock signal; and
(e) adjusting an amplitude of said first divided clock signal and an amplitude of said second divided clock signal such that the divided clock transition delay is substantially equal to the input clock transition delay, wherein said amplitude of said first divided clock signal is substantially equal to said amplitude of said first clock signal immediately prior to a transition of said first clock signal from one steady state value to another steady state value, wherein said amplitude of said second divided clock signal is substantially equal to an amplitude of said second clock (signal immediately prior to a transition of said second clock signal from one steady state value to another steady state value,
   thereby causing said first divided clock signal and said second divided clock signal to more quickly transition to steady state values.

6. A transition delay matching circuit comprising:
(a) a clock driver having
   (i) a first clock terminal to receive a first clock, said first clock having a first frequency,
   (ii) a second clock terminal to receive a second clock, said second clock having said first frequency, wherein said second clock is substantially 180 degrees out of phase with said first clock,
   (iii) a first output clock terminal for driving a first output clock, said first output clock having said first frequency, and
   (iv) a second output clock terminal for driving a second output clock, said second output clock having said first frequency, wherein said second output clock is substantially 180 degrees out of phase with said first output clock;
(b) a third clock, said third clock having a second frequency, wherein said third clock is substantially in phase with said first output clock, wherein said second frequency is a harmonic of said first frequency;
(c) a fourth clock, said fourth clock having said second frequency, wherein said fourth clock is substantially in phase with said second output clock; and
(d) amplitude limiting means for limiting a divided clock steady state voltage differential between said first output clock and said second output clock, wherein said amplitude limiting means is selected such that said output clock steady state voltage differential is substantially equal to a voltage differential between said third clock and said fourth clock immediately prior to a transition of said third clock from one steady state value to another steady state value,
   thereby causing said first output clock and said second output clock to more quickly transition to steady state values.

7. The transition delay matching circuit of claim 6 wherein said amplitude limiting means comprises a resistor coupled between said first output clock terminal and said second output clock terminal.

8. The transition delay matching circuit of claim 6 wherein said amplitude limiting means comprises:
   (a) a first resistor coupled between said first output clock terminal and a common mode voltage; and
   (b) a second resistor coupled between said second output clock terminal and said common mode voltage,
      wherein said common mode voltage is substantially the average of the voltage level of the first output clock and the voltage level of the second output clock at any given time.

9. A transition delay matching circuit comprising:
   (a) a clock driver having
      (i) a clock terminal to receive a first clock, said first clock having a first frequency, and
      (ii) an output clock terminal for driving said output clock, said output clock having said first frequency;
   (b) a second clock, said second clock having a second frequency, wherein said second clock is substantially in phase with said output clock, wherein said second frequency is a harmonic of said first frequency;
   (c) amplitude limiting means for limiting a first steady state voltage differential between a high output voltage of said output clock and a low output voltage of said output clock, wherein said amplitude limiting means causes said first steady state voltage differential to be substantially equal to a second voltage differential between a high voltage level of said second clock immediately prior to a transition of said second clock from said high voltage level to a low voltage level and said low voltage level of said second clock immediately prior to a transition of said second clock from said low voltage level to said high voltage level, so that said output clock more quickly transitions to a steady state value.

10. The transition delay matching circuit of claim 9 wherein said amplitude limiting means comprises a resistor coupled between said first output clock terminal and a voltage level.

11. The transition delay matching circuit of claim 10 wherein said voltage level comprises a voltage level substantially equal to an average of said high voltage level of said output clock and said low voltage level of said output clock.

12. A method of matching a divided clock transition delay to an input clock transition delay, comprising the steps of:
   (a) receiving a first clock signal having the divided clock transition delay, said first clock signal having a first frequency;
   (b) receiving a second clock signal having the divided clock transition delay, said second clock having a first frequency, wherein said second clock signal is substantially 180 degrees out of phase with said first clock signal;
   (c) receiving a third clock signal having the input clock transition delay, said third clock having a second frequency, wherein said third clock signal is substantially in phase with said first clock signal, wherein said second frequency is a harmonic of said first frequency;
   (d) receiving a fourth clock signal having the input clock transition delay, said fourth clock having a second frequency, wherein said fourth clock signal is substantially in phase with said second clock signal;
   (e) adjusting an amplitude of said first clock signal such that the divided clock transition delay is substantially equal to the input clock transition delay, wherein said amplitude of said first clock signal is substantially equal to said amplitude of said third clock signal immediately prior to a transition of said third clock signal from one steady state value to another steady state value; and
   (f) adjusting an amplitude of said second clock signal, wherein said amplitude of said second clock signal is substantially equal to an amplitude of said fourth clock signal immediately prior to a transition of said fourth clock signal from one steady state value to another steady state value,
      thereby causing said first clock signal and said second clock signal to more quickly transition to steady state values.

13. A method of matching a divided clock transition delay to an input clock transition delay, comprising the steps of:
   (a) receiving a first clock signal having the divided clock transition delay, said first clock signal having a first frequency;
   (b) receiving a second clock signal having the input clock transition delay, said second clock having a second frequency, wherein said second clock signal is substantially in phase with said first clock signal, wherein said second frequency is a harmonic of said first frequency; and
   (c) adjusting an amplitude of said first clock signal such that the divided clock transition delay is substantially equal to the input clock transition delay, wherein said amplitude of said first clock signal is substantially equal to said amplitude of said third clock signal immediately prior to a transition of said third clock signal from one steady state value to another steady state value,
      thereby causing said first clock signal to more quickly transition to a steady state value.

\* \* \* \* \*